United States Patent [19]

Kawazoe et al.

[11] 4,451,525

[45] May 29, 1984

[54] PRODUCTS HAVING COMPOUND MEMBRANE

[75] Inventors: Shiyouzou Kawazoe; Zenichi Ueda; Toshihiko Sugimoto; Takahiko Moriuchi, all of Osaka, Japan

[73] Assignee: Nitto Electric Industrial Co., Ltd., Osaka, Japan

[21] Appl. No.: 244,929

[22] Filed: Mar. 18, 1981

[30] Foreign Application Priority Data

Mar. 19, 1980 [JP] Japan .................................. 55-35475

[51] Int. Cl.$^3$ ......................... B32B 7/02; B32B 15/08
[52] U.S. Cl. .................................... 428/213; 428/215; 428/216; 428/416; 428/425.8; 428/433; 428/457; 428/461; 428/469; 428/701
[58] Field of Search ............... 428/216, 213, 416, 457, 428/425.8, 469, 461, 215, 701, 432, 433, 421

[56] References Cited

U.S. PATENT DOCUMENTS 4,056,654 11/1977 Kompanek ......................... 428/70 X
4,064,030 12/1977 Nakai et al. ....................... 428/44 X Primary Examiner—Thomas J. Herbert, Jr.
Attorney, Agent, or Firm—Sughrue, Mion, Zinn, Macpeak & Seas

[57] ABSTRACT

A product with a compound membrane which comprises a molded substrate, a metal membrane having an average thickness equal to or less than the maximum surface roughness of the molded substrate on the molded substrate and a dielectric membrane having a thickness of 100 Å or more on the metal membrane.

10 Claims, 1 Drawing Figure

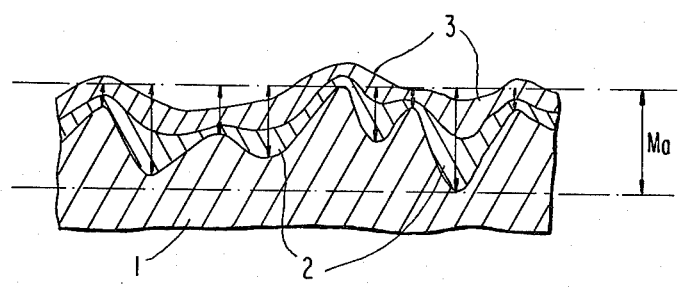

PRODUCTS HAVING COMPOUND MEMBRANE

FIELD OF THE INVENTION

The present invention relates to various products having a compound membrane of a metal membrane and a dielectric membrane provided on a molded substrate.

BACKGROUND OF THE INVENTION

Products having a metal membrane provided on a molded substrate in which the electrically conductive property or the infrared ray reflectivity of the membrane is utilized are known. Particularly, membrane products having a transparent molded substrate such as a transparent electrically conductive membrane, a selective light-transparent membrane (transparent heat-insulating membrane), etc. are extremely useful.

Among these known products with a metal membrane, not only are there products with a metal membrane applied directly to the surface of the substrate but also products with a dielectric membrane composed of a metal oxide such as titanium oxide, bismuth oxide, etc. or other dielectrics such as zinc sulfide, etc. provided between the substrate and a metal membrane for electric characteristics, optical characteristics, etc. and products having the above described dielectric membranes provided between the substrate and the metal membrane and on the metal membrane.

In these prior membrane products, however the adhesivity of the membrane to the substrate is generally poor, and it is particularly poor in products having a metal membrane provided directly on the substrate. Further, with products other than those with another membrane on the surface of the metal membrane, unavoidably durability such as abrasion resistance, chemical resistance, moisture resistance, heat resistance, etc. of the metal membrane is poor and various characteristics such as the electric characteristics, the optical characteristics, etc. deteriorate during the use, because the metal membrane is exposed.

SUMMARY OF THE INVENTION

As a result of extensive research, in view of the above circumstances, in order to obtain membrane products having improved adhesivity of the metal membrane to the substrate and excellent durability the present invention has been completed.

The present invention provides a product having a compound membrane which comprises a molded substrate having a metal membrane with an average thickness equal to the maximum surface roughness or less than that of the molded substrate and a dielectric membrane having a thickness of 100 Å or more on the metal membrane.

BRIEF DESCRIPTION OF THE DRAWING

The FIGURE is a partial enlarged sectional view of an example of a sheet product having a compound membrane according to the present invention.

DETAILED DESCRIPTION OF THE INVENTION

The FIGURE shows an example of a sheet product with a compound membrane according to the present invention wherein 1 is a molded substrate, 2 is a metal membrane and 3 is a dielectric membrane. The maximum surface roughness of the molded substrate 1 in the present invention is Ma shown in the FIGURE and the thickness of the metal membrane 2 and the dielectric membrane 3 is the average thickness thereof.

In the present invention, as described above, a metal membrane is provided on a molded substrate and a dielectric membrane having a specific thickness is provided on the metal membrane. In this case, when the average thickness of the metal membrane is equal to or less than the maximum surface roughness of the molded substrate, the adhesion between the substrate and the metal membrane and that between the metal membrane and the dielectric membrane are improved, although the reason for the improved adhesion is not always obvious, by which membrane products having an improved adhesivity as compared to prior art products can be obtained.

Thus, since the metal membrane is not exposed outwardly in such a structure, it is possible to improve durability such as abrasion resistance, moisture resistance, chemical resistance and the like of the metal membrane. Further, it has been found that the dielectric membrane on the metal membrane does not adversely influence the electrical conductivity and the infrared light reflectivity of the metal membrane but rather the visible light transmittance is larger than that of only the metal membrane. It is thus possible to provide transparent membrane products extremely suitable for use as transparent electrically conductive membranes, transparent heat-insulating membranes, etc. by using a transparent substrate.

Molded substrates which can be used in the present invention include sheets, films and other moldings of various materials such as glass or synthetic resins such as polyesters, polycarbonates, polyamides, polyimides, polyethylenes, polyvinyl chlorides, polyacrylic resins, polytetrafluoroethylene, cellulose triacetates, polyvinylidene chlorides, polystyrene, polyvinyl alcohols, polypropylenes polyurethanes, polybutenes, poly-4-methyl-pentenes, propylene-ethylene fluoride copolymers, ethylene-ethylene fluoride copolymers, etc.

Where the products according to the present invention are used as transparent electrically conductive membranes, it is preferred for the substrates to be transparent.

The maximum surface roughness of the molded substrate is generally about 50 Å or more and preferably 100 Å or more. If the maximum surface roughness is less than about 50 Å, it is difficult to form a continuous coated film in forming a metal membrane having a lower thickness than the maximum surface roughness. Further, the upper limit of the surface roughness of the molded substrate is about 5 μm (50,000 Å) and preferably 2 μm. Conventional glass and synthetic resin sheets satisfy the above described requirement, but other molded substrate which do not satisfy the above described requirement should be subjected to an etching treatment and/or under coating treatment to promote surface roughness, as disclosed in, for example, U.S. Pat. No. 4,064,030. Alternatively, substrates which satisfy the above described requirement may be subjected to an etching treatment, by which good results are obtained because of the good adhesion between the substrate and the membrane. Suitable etching treatment methods which can be used are a sputtering treatment, a corona discharging treatment, a flame treatment, application of ultraviolet light, application of electron beams, a chemical treatment, treatment with an oxidizing agent, etc.

In order to form an undercoating layer in an undercoating treatment, a resin coating such as an organic solvent type coating, an emulsion type coating, a non-solvent type coating, etc. is prepared and applied to the molded substrate to a desired thickness. It is then hardened appropriately, such as hardening with heating, hardening at room temperature, hardening by application of electron beams or ultraviolet light, etc.

In obtaining membrane products using a transparent molded substrate so as to utilize the transparency thereof, it is generally preferred for the maximum roughness of the molded substrate to be at the most about 20,000 Å (2 μm) or so, because transparency is remarkably degraded by light scattering or light absorption, if the surface roughness is too high.

The maximum surface roughness is measured according to the criteria of JIS (Japanese Industrial Standard) BO601-1976.

The molded substrate with such a surface roughness may be previously cleaned, if necessary, to remove dust, such as by solvent cleaning, ultrasonic cleaning, etc. in order to form the metal membrane thereon.

Materials which can be used for the metal membrane is the present invention are various metals such as Ag, Au, Cu, Al, Ni, Pd, Sn, Fe, Co, Zn, Si, In, Sb, Bi, Pt, etc. and alloys thereof such as In-Sn, Ni-Co, Sn-Zn, Fe-Co, Fe-Zn, etc. In obtaining transparent membrane products, a metal or an alloy which causes less light absorption in the visible light range is selected from these materials dependent on the end use. For example, Ag, Cu, Pd, etc. are suitable for transparent electrically conductive membranes with high visible light transmittance and Au, Ag, Cu, etc. are suitable for selective light transparent membranes with high reflectivity for infrared rays.

Processes which can be used to form the metal membranes, include, for example, a vacuum evaporation process, a sputtering process, a plasma process, a vapor phase plating process, a chemical plating process, an electroplating process, a chemical coating process and combinations thereof. The most preferred process is the vacuum evaporation process from the standpoint of homogeneity of the membrane, film formation rate and processing properties.

The thickness of the metal membrane should be equal to the maximum surface roughness or less than that of the substrate to improve the adhesion to the substrate. If it is larger than the maximum surface roughness, improvement in adhesion is not obtained. On the other hand, to obtain a continuous coated film exhibiting the inherent electrical conductivity or infrared ray reflectivity of the metal membrane itself, it is generally preferred for the thickness to be at least about 50 Å and preferably 100 Å or more.

Better results are obtained in electrical conductivity and infrared ray reflectance within the above-described range as the thickness is increased. Conversely, from the standpoint of visible light transmittance, the transmittance is enhanced further because the light transmittance range is broadened as the thickness decreases. Therefore, it is preferred for the thickness to be less than about 250 to about 300 Å when transparent membrane products are desired.

In the present invention, the dielectric membrane is formed on the above-described metal membrane, by which the adhesion of each membrane is improved together with an improvement in durability. Suitable materials which can be used for the dielectric membrane include organic materials such as metal oxides, metal sulfides, metal fluorides, etc., and organic materials such as polyurethane resins, epoxy resins, acrylic resins, etc. which have the function of a dielectric. In transparent membrane products, materials having a refractive index of about 1.3 or more and preferably 1.5 or more for visible light and a visible light transmittance of about 50% or more and preferably 70% or more can be employed. Typical dielectric materials are $MgF_2$, SiO, $SnO_x$ ($1 \leq x \leq 2$) and ZnS, etc. In addition, $SiO_2$, $Si_2C_3$, $Al_2O_3$, TiO, $TiO_2$, $Bi_2O_3$ and $In_2O_{1-3}$, etc. can be used. These materials can be used alone or as a combination of two or more thereof. Techniques for forming the membrane include, for example, a vacuum evaporation process, a sputtering process, an ionplating process and a coating process, etc.

The dielectric membrane must have a thickness of at least about 100 Å, because a continuous coated film of the membrane is difficult to form or the durability of the membrane is not sufficiently improved even if a continuous coated film is formed. On the other hand, if the thickness is too large, there is the possibility that cracks or a separation of the membrane due to a difference in the coefficient of linear expansion between the molded substrate and the dielectric membrane can occur and, consequently, the improvement of adhesion or durability as main objects of the invention is sometimes not obtained. Accordingly, it is generally preferred for the thickness of the dielectric membrane to be about 60,000 Å or less. Further, in order to maintain the infrared ray reflectivity of the metal membrane at a high value and increase the visible light transmittance so as to obtain suitable transparent membrane products, the thickness is generally about 3000 Å or less and preferably 1000 Å or less. Of course, the optimum range of the thickness depends upon the materials used for the dielectric membrane, the surface roughness of the transparent substrate and the materials for the metal membrane, etc.

In the present invention, the thickness of the metal membrane and dielectric membrane can be measured by a contact method using a surface roughness and shape measurement device, Surfcom 404A, a product of Tokyo Seimitsu Co. The contact method means that, with respect to the measurement of the thickness of the metal membrane, for example, the difference in height is measured and the difference measured is employed as a membrane thickness (average).

As described above in detail, products having a compound membrane of the present invention have excellent adhesion of the membrane to the molded substrate as well as durability of the membrane such as abrasion resistance, solvent resistance, chemical resistance or heat resistance, etc. Accordingly, they can be utilized widely for various uses where the inherent electroconductivity and infrared light reflectance of the membrane are utilized. Particularly, transparent membrane products using transparent substrates can be utilized as transparent electrically conductive membranes in the fields of electronics and electricity, such as electrodes for solid state displays such as a liquid crystal display, an electroluminescent display, a plasma display or a ferromagnetic display, etc., electrodes for electric field luminophors or electrodes for electrophotographic sensitive materials, etc. and as antistatic or anti-frosting window glass or other materials. Further, they can be widely used as selective light-transparent membranes or transparent heat-insulating membranes in fields of solar energy utilization, such as a solar energy collectors (hot water tank) or a solar electric generator, etc., and for uses such as films for green houses or transparent heat-insulating windows for buildings, etc.

In addition, in order to further improve the abrasion resistance and the moisture resistance of the compound membrane of the present invention, a protective coating may be applied, if desired, to the membrane. The protective coating has a thickness of about 0.1 to about 50μ, preferably 1 to 20μ. It is preferred for the protective coating to be transparent when the transparent membrane product is desired. In order to form the protective coating layer, generally, a synthetic resin coating such as an organic solvent type coating, an emulsion type coating or a solventless type coating, etc. is prepared and applied to the compound membrane of the present invention in a precribed thickness, which is then hardened by appropriately, for example, by hardening with heating, hardening at room temperature or hardening by application of electron beams or ultraviolet light, etc.

Suitable resins which can be used for forming the protective coating include many known resins including epoxy resins, polyester resins, urethane resins, alkyd resins, vinyl chloride-vinyl acetate copolymer resins and acrylic resins, etc.

The means for application can be by gravure roll coating, wire bar coating, doctor blade coating, reverse roll coating, dip coating, air knife coating, kiss coating, nip coating and fan coating, etc.

Moreover, in order to provide adhesivity, etc. to the compound membrane of the present invention, the membrane may be subjected to, if desired, a suitable processing.

Specific examples of the present invention are described below. In the following, the visible light transmittance means the percent transmittance of the product having a molded substrate at a wavelength of 0.6 μm, and the infrared light reflectance means the percent reflectance at a wavelength of 2.5 μm measured by an Infrared Spectrometer Type A-3 produced by Nippon Bunko Kogyo Co. equipped with a reflection measuring device, which is a relative value based on the reflectance of a standard mirror having a Ag membrane of a sufficient thickness of about 4000 Å being 100%. The surface roughness of the molded substrate means the value measured using a Surfcom 404A produced by Tokyo Seimitsu Co. The surface resistance of the membrane product, the abrasion resistance, the adhesivity, the chemical resistance and the moisture resistance were measured by the following methods.

(a) Surface Resistance

A membrane product was cut in a width of 1 cm and an electrically conductive coating was applied in a width of 5 mm at an interval of 1 cm. Then, the resistance between the resulting electrically conductive coated films was measured.

(b) Abrasion Resistance

The surface of the membrane product was rubbed with a finger. A product where the membrane was easily stripped therefrom was evaluated as (×), a product where the membrane is partially stripped was evaluated as (Δ) and a product where the membrane was not stripped at all was evaluated as (o).

(c) Adhesive Property

Cross-hatch cuts of 1 mm square were formed on the membrane product. A cellophane tape No. 29 produced by Nitro Electric Industrial Co. was adhered to the membrane product and the number of cross-cuts remaining out of 100 was counted after the tape was rapidly stripped off.

(d) Solvent Resistance

A membrane product was immersed in toluene, and changes in color tone, visible light transmittance and infrared light reflectance of the membrane with the lapse of time were examined.

(e) Moisture Resistance B

A membrane product was allowed to stand in an atmosphere of high temperature and high humidity (85° C.×95%, RH), and changes in color tone, visible light transmittance, infrared light reflectance and surface resistance were examined.

EXAMPLE 1

After a bell jar was evacuated to $1-2\times10^{-4}$ Torr, vacuum evaporation of Ag on a tungsten board was carried out by a resistance heating method at an evaporation rate of several tens Å/second to form a Ag membrane having a thickness of 200 Å on a polyester film (Lumilar #100-T produced by Toray Industries, Inc.) having a thickness of 100μ and a surface roughness of 100–500 Å set at a distance of about 20 cm from the evaporation source.

To the above described Ag membrane, SiO was then applied by vacuum evaporation at several tens Å/second at $1-2\times10^{-4}$ Torr by a resistance heating method to form a SiO dielectric membrane having a thickness of about 460 Å. Thus a sheet having a compound membrane of the present invention was prepared.

The characteristics of this sheet are shown in Table 1. The procedures described above were repeated except for the SiO vacuum evaporation to produce a comparison sample and the characteristics of this sheet are also shown in Table 1 below. In Table 1, A represents the results on the product of this Example, and B represents the results on the compares in product in which a SiO dielectric membrane was not formed.

TABLE 1

| | A | B |
|---|---|---|
| Adhesive Property | 100 | 70 |
| Abrasion Resistance | o | x |
| Visible Light Transmittance (%) | 67 | 40 |
| Infrared Light Reflectance (%) | 96 | 96 |
| Surface Resistance ($\Omega/cm^2$) | 7 | 4 |

EXAMPLE 2

Several kinds of sheets with the compound membrane of the present invention were prepared using the same procedures as in Example 1 except that the thickness of the Ag membrane was varied as shown in Table 2 below. The characteristics of these sheets were as shown in Table 2. For the purpose of comparison, sheets were produced using the same procedures but with the thickness of the Ag membrane being beyond the scope of the present invention and the results are shown together as comparative examples. In Table 2, A and B have the same meaning as in Table 1.

TABLE 2

| Thickness of Ag Membrane (Å) | Adhesive Property | | Abrasion Resistance | | Visible Light Transmittance (%) | | Infrared Light Reflectance (%) | | Surface Resistance (Ω/cm$^2$) | |
| --- | --- | --- | --- | --- | --- | --- | --- | --- | --- | --- |
| | A | B | A | B | A | B | A | B | A | B |
| Example 2 | | | | | | | | | | |
| 50 | 100 | 100 | o | x | 55 | 45 | 26 | 26 | 10$^6$ or more | 10$^6$ or more |
| 100 | 100 | 100 | o | x | 50 | 41 | 65 | 65 | 40 | 35 |
| 150 | 100 | 88 | o | x | 62 | 40 | 88 | 88 | 10 | 10 |
| 280 | 100 | 81 | o | x | 53 | 27 | 97 | 97 | 4 | 3 |
| 400 | 98 | 70 | o | x | 22 | 12 | 99 | 99 | 4 | 2 |
| 500 | 95 | 56 | o | x ~ Δ | 14 | 6 | 99 | 99 | 3 | 1.5 |
| Comparative Example | | | | | | | | | | |
| 560 | 40 | 30 | Δ ~ o | x ~ Δ | 13 | 4 | 99 | 99 | 3 | 1.5 |
| 700 | 20 | 15 | Δ | x ~ Δ | 10 | 3 | 100 | 100 | 2 | 1 |
| 1000 | 6 | 0 | Δ | x ~ Δ | 6 | 1 | 100 | 100 | 1 | 1 |

EXAMPLE 3

Several kinds of sheets with the compound membrane of the present invention were prepared along the same procedures as in Example 1, except that a SnO$_x$ (1 ≦ X ≦ 2) membrane having a thickness of about 300 Å was formed instead of the SiO dielectric membrane having a thickness of about 460 Å of Example 1 and the thickness of the Ag membrane was varied as shown in Table 3 below. The characteristics of these sheets are as shown in Table 3. For the purpose of comparison, the results for sheets wherein the thickness of the Ag membrane was beyond the scope of the present invention are shown in Table 3 as comparative examples. The results for the product wherein the SnO$_x$ dielectric membrane was not formed are not shown in Table 3 because such corresponds to B in Table 1 and Table 2.

TABLE 3

| Thickness of Ag Membrane (Å) | Adhesive Property | Abrasion Resistance | Visible Light Transmittance (%) | Infrared Light Reflectance (%) | Surface Resistance (Ω/cm$^2$) |
| --- | --- | --- | --- | --- | --- |
| Example 3 | | | | | |
| 50 | 100 | o | 55 | 26 | 10$^6$ or more |
| 100 | 100 | o | 50 | 65 | 40 |
| 150 | 100 | o | 63 | 88 | 9 |
| 200 | 100 | o | 67 | 96 | 6 |
| 280 | 100 | o | 56 | 97 | 4 |
| 400 | 100 | o | 25 | 99 | 3 |
| 500 | 96 | o | 16 | 99 | 2 |
| Comparative Example | | | | | |
| 560 | 40 | Δ ~ o | 15 | 99 | 2 |
| 700 | 23 | Δ | 13 | 100 | 2 |
| 1000 | 0 | Δ | 8 | 100 | 1 |

EXAMPLE 4

Several kinds of sheets with the compound membrane of the present invention were prepared using the same procedures as in Example 1, except that the thickness of the SiO dielectric membrane was varied as shown in Table 4 below. The characteristics of these sheets are as shown in Table 4 below. For the purpose of comparison, the results for a sheet wherein the thickness of the SiO dielectric membrane was beyond the scope of the present invention are shown in Table 4 as a comparative example.

TABLE 4

| Thickness of Ag Membrane (Å) | Adhesive Property | Abrasion Resistance | Visible Light Transmittance (%) | Infrared Light Reflectance (%) | Surface Resistance (Ω/cm$^2$) |
| --- | --- | --- | --- | --- | --- |
| Comparative Example | | | | | |
| 50 | 78 | x | 40 | 91 | 7 |
| Example 4 | | | | | |
| 100 | 100 | Δ | 41 | 92 | — |
| 150 | 100 | o | 42 | 92 | — |
| 270 | 100 | o | 57 | 92 | — |
| 440 | 100 | o | 67 | 95 | 8 |
| 500 | 100 | o | 66 | 94 | 10 |
| 700 | 100 | o | 58 | 93 | — |
| 1500 | 100 | o | 42 | 87 | 10 |
| 3000 | 100 | o | 40 | 85 | — |
| 60000 | 90 | o | 37 | 80 | — |

Solvent resistance and moisture resistance were measured for sheets in which the thickness of the SiO dielectric membrane was 440 Å. The results are shown in Table 5 below. A and B in Table 5 are the same as in Table 1.

of this membrane was varied as described in the Table 6 below. For the purpose of comparison, the results for a sheet wherein the thickness of the $SnO_x$ dielectric mem-

TABLE 5

|  | Color Tone | | Visible Light Transmittance (%) | | Infrared Light Reflectance (%) | | Surface Resistance ($\Omega/cm^2$) | |
| --- | --- | --- | --- | --- | --- | --- | --- | --- |
|  | A | B | A | B | A | B | A | B |
| Solvent Resistance* | | | | | | | | |
| Initial | Light blue | Blue | 67 | 40 | 95 | 94 | — | — |
| After 178 hours | — | — | 67 | 34 | 96 | 79 | — | — |
| After 440 hours | Light blue | Brown | 67 | 33 | 97 | 46 | — | — |
| After 1000 hours | Light blue | Brown | 67 | 25 | 95 | 15 | — | — |
| Moisture Resistance | | | | | | | | |
| Initial | Light blue | Blue | 67 | 40 | 95 | 94 | 8 | 4 |
| After 1 hour | Light blue | Brown | 65 | 37 | 95 | 45 | 8 | 40 |
| After 3 hours | — | — | 63 | 32 | 92 | 39 | 9 | 300 |
| After 8 hours | Light blue | Brown | 64 | 30 | 94 | 34 | 10 | 300 or more |
| After 50 hours | Light blue | Brown | 64 | 25 | 94 | 10 | 10 | 300 or more |

*The same results as described above were obtained when xylene, benzene, chlorobenzene, trichloroethylene, acetone, methyl ethyl ketone, tetrahydrofuran, methanol or ethanol was used as the organic solvent rather than toluene.

EXAMPLE 5

Several kinds of sheets with the compound membrane of the present invention were prepared using the same procedures as in Example 1, except that a $SnO_x(1 \leq X \leq 2)$ dielectric membrane was formed instead of the SiO dielectric membrane and the thickness brane was beyond the scope of the present invention are shown in Table 6 below as a comparative example.

TABLE 6

| Thickness of SnO Membrane (Å) | Adhesive Property | Abrasion Resistance | Visible Light Transmittance (%) | Infrared Light Reflectance (%) | Surface Resistance ($\Omega/cm^2$) |
| --- | --- | --- | --- | --- | --- |
| Comparative Example | | | | | |
| 50 | 80 | x | 40 | 92 | 7 |
| Example 5 | | | | | |
| 100 | 100 | Δ | 41 | 92 | — |
| 150 | 100 | o | 41 | 92 | — |
| 210 | 100 | o | 47 | 92 | — |
| 290 | 100 | o | 66 | 93 | 8 |
| 330 | 100 | o | 63 | 93 | 8 |
| 400 | 100 | o | 60 | 95 | 10 |
| 500 | 100 | o | 51 | 90 | — |
| 700 | 100 | o | 40 | 80 | — |
| 1000 | 100 | o | 40 | 79 | 10 |
| 2000 | 100 | o | 38 | 70 | — |
| 50000 | 97 | o | 34 | 63 | — |

Solvent resistance and moisture resistance were measured for the sheet wherein the thickness of the $SnO_x$ dielectric membrane was 290 Å. The results are as shown in Table 7 below.

TABLE 7

|  | Color Tone | Visible Light Transmittance (%) | Infrared Light Reflectance (%) | Surface Resistance ($\Omega/cm^2$) |
| --- | --- | --- | --- | --- |
| Solvent Resistance* | | | | |
| Initial | Light blue | 66 | 94 | — |
| After 178 hours | — | 65 | 96 | — |
| After 440 hours | Light blue | 66 | 95 | — |
| After 1000 hours | Light blue | 66 | 95 | — |
| Moisture Resistance | | | | |
| Initial | Light blue | 67 | 98 | 8 |
| After 1 hour | Light blue | 68 | 98 | 8 |
| After 3 hours | — | 67 | 95 | 9 |
| After 8 hours | Light blue | 65 | 97 | 10 |
| After 50 hours | Light blue | 66 | 96 | 9 |

*The same results were obtained when the same solvents as described in the footnote to Table 5 were used as the organic solvent rather than toluene.

EXAMPLE 6

Several kinds of sheets with the compound membrane of the present invention were prepared using the same procedures as in Example 1, except that a ZnS dielectric membrane was formed instead of the SiO dielectric membrane and the thickness of this membrane was varied as shown in Table 8 below. The characteristics of these sheets are as shown in Table 8. For the purpose of comparison, the results for a sheet in which the thickness of the ZnS dielectric membrane was beyond the scope of the present invention are shown in Table 8 as a comparative example.

TABLE 8

| Thickness of ZnS Membrane (Å) | Adhesive Property | Abrasion Resistance | Visible Light Transmittance (%) | Infrared Light Reflectance (%) | Surface Resistance (Ω/cm$^2$) |
| --- | --- | --- | --- | --- | --- |
| Comparative Example | | | | | |
| 50 | 76 | x | 40 | 97 | 6 |
| Example 6 | | | | | |
| 100 | 100 | Δ | 44 | 98 | — |
| 200 | 100 | o | 59 | 98 | 6 |
| 300 | 100 | o | 66 | 98 | 6 |
| 430 | 100 | o | 60 | 98 | 6 |
| 500 | 100 | o | 55 | 98 | — |
| 1000 | 100 | o | 45 | 98 | 7 |
| 2000 | 100 | o | 40 | 86 | — |
| 60000 | 96 | o | 35 | 68 | — |

EXAMPLE 7

Several kinds of sheets with the membrane of the present invention were prepared using the same procedures as in Example 1, except that a MgF$_2$ dielectric membrane was formed instead of the SiO dielectric membrane and the thickness of this membrane was varied as shown in the Table 9 below. The characteristics of these sheets are as shown in Table 9 below. For the purpose of comparison, the results on the sheet in which the thickness of the MgF$_2$ dielectric membrane was beyond the scope of the present invention are shown in Table 8 as a comparative example.

TABLE 9

| Thickness of MgF$_2$ Membrane (Å) | Adhesive Property | Abrasion Resistance | Visible Light Transmittance (%) | Infrared Light Reflectance (%) | Surface Resistance (Ω/cm$^2$) |
| --- | --- | --- | --- | --- | --- |
| Comparative Example | | | | | |
| 50 | 79 | x | 40 | 97 | 6 |
| Example 7 | | | | | |
| 100 | 100 | Δ | 41 | 98 | — |
| 200 | 100 | o | 45 | 98 | — |
| 400 | 100 | o | 50 | 98 | 6 |
| 600 | 100 | o | 55 | 98 | 7 |
| 1000 | 100 | o | 45 | 98 | 8 |
| 2000 | 100 | o | 40 | 86 | — |
| 50000 | 98 | o | 36 | 80 | — |

EXAMPLES 8–14

Several kinds of sheets with the compound membrane of the present invention were prepared using the same procedures as in Example 1, except that various kinds of metal membranes having the thickness shown in the Table 10 below were formed instead of the Ag membrane with a thickness of 200 Å and the thickness of the SiO dielectric membrane was 300 Å. The characteristics of these sheets are as shown in Table 10 below. In Table 10, A and B are the same as in Table 1.

TABLE 10

| Example | Metal Membrane Kind | Metal Membrane Thickness (Å) | Adhesive Property A | Adhesive Property B | Abrasion Resistance A | Abrasion Resistance B | Visible Light Transmittance (%) A | Visible Light Transmittance (%) B |
| --- | --- | --- | --- | --- | --- | --- | --- | --- |
| 8 | Au | 225 | 100 | 70 | o | x | 57 | 33 |
| 9 | Cu | 190 | 100 | 85 | o | x ~ Δ | 62 | 45 |
| 10 | Al | 130 | 100 | 90 | o | x ~ Δ | 38 | 20 |
| 11 | Sn | 200 | 100 | 84 | o | x | 20 | 10 |
| 12 | Bi | 220 | 100 | 86 | o | x | 34 | 22 |
| 13 | Ni | 170 | 100 | 87 | o | x | 39 | 20 |
| 14 | Pd | 180 | 100 | 90 | o | x | 41 | 21 |

EXAMPLES 15–20

Several kinds of sheets with the compound membrane of the present invention were prepared using the same procedures as in Example 1, except that the thickness of the SiO dielectric membrane was 600 Å and various substrate films having the surface roughness shown in the Table 11 below were used instead of the polyester film. The characteristics of these sheets are as shown in Table 11. A and B are the same as those in Table 1.

TABLE 11

| Example | Substrate Film Material | Surface roughness (Å) | Adhesive Property A | Adhesive Property B | Abrasion Resistance A | Abrasion Resistance B | Visible Light Transmittance (%) A | Visible Light Transmittance (%) B |
|---|---|---|---|---|---|---|---|---|
| 15 | Polyamide[*1] | 290–1160 | 100 | 95 | o | Δ | 58 | 40 |
| 16 | Acrylic resin[*2] | 200–800 | 100 | 90 | o | x ~ Δ | 45 | 25 |
| 17 | Polycarbonate[*3] | 160–500 | 100 | 60 | o | x ~ Δ | 55 | 35 |
| 18 | Polyimide-(1)[*4] | 125–500 | 100 | 77 | o | x ~ Δ | 42 | 26 |
| 19 | Polyimide-(2)[*5] | 60–300 | 100 | 50 | o | x | 40 | 25 |
| 20 | Triacetate[*6] | 100–500 | 100 | 55 | o | x | 50 | 35 |

[*1]Nylon-66 produced by Nippon Rirusan Co; Thickness: 25 μ.
[*2]Panlite film produced by Teijin Limited; Thickness: 75 μ.
[*3]Tradlon produced by Exxon Co.: Thickness: 125 μ.
[*4]Sunduren produced by Kanegafuchi Chemical Ind. Co.; Thickness: 100 μ.
[*5]Kapton produced by Toray Industries, Ltd.; Thickness: 50 μ.
[*6]Fuji Tac produced by Fuji Photo Film Co. Thickness: 100 μ.

EXAMPLES 21–22

Two kinds of sheets with the compound membrane of the present invention were prepared using the same procedures as in Example 1, except that the thickness of the SiO dielectric membrane was 600 Å, the thickness of the Ag membrane was 100 Å, and a film resistant to scratching having a surface roughness of 35–140 Å (Example 21) and soda glass having a surface roughness of 20–130 Å (Examples 22) were used instead of the polyester film. The characteristics of these two sheets are as shown in the Table 12 below. For the purpose of comparison, results for sheets in which the thickness of the Ag membrane was beyond the scope of the present invention, namely 200 Å are shown in Table 12 as comparative examples. In Table 12, A and B are the same as in Table 1.

TABLE 12

| Substrate Film | Thickness of Ag Membrane (Å) | Adhesive Property A | Adhesive Property B | Abrasion Resistance A | Abrasion Resistance B | Visible Light Transmittance (%) A | Visible Light Transmittance (%) B |
|---|---|---|---|---|---|---|---|
| | | Example 21 | | | | | |
| Film resistant to scratching[*1] | 100 | 100 | 40 | o | x | 50 | 35 |
| | | Comparative Example | | | | | |
| | 200 | 0 | 0 | x ~ Δ | x | 47 | 33 |
| | | Example 22 | | | | | |
| Soda glass[*2] | 100 | 97 | 33 | o | x | 67 | 45 |
| | | Comparative Example | | | | | |
| | 200 | 0 | 0 | x ~ Δ | x | 63 | 43 |

[*1]AR Film produced by Toray Industries, Inc.: Thickness: 100 μ.
[*2]Microslide glass produced by Matsunami Glass Co.; Thickness: 0.9 mm.

While the invention has been described in detail and with reference to specific embodiments thereof, it will be apparent to one skilled in the art that various changes and modifications can be made therein without departing from the spirit and scope thereof.

What is claimed is:

1. A product with a compound membrane which comprises a transparent molded substrate having a maximum surface roughness of about 50 to 20,000 Å, a metal membrane having an average thickness of about 50 to 300 Å which is equal to or less than the maximum surface roughness of the molded substrate on said molded substrate and a dielectric membrane having a thickness of 100 to 60,00 Å and having a refractive index of about 1.3 or more for visible light and a visible light transmittance of about 50% or more on said metal membrane.

2. The product of claim 1, wherein said molded substrate is a sheet, film or other molded shape of glass or a synthetic resin.

3. The product of claim 1, wherein said metal membrane is a membrane of a metal selected from the group consisting of silver, gold, copper, aluminum, nickel, palladium, tin, iron, cobalt, zinc, silicon, indium, antimony bismuth, platinum, or alloys thereof.

4. The product of claim 1, wherein said metal membrane is silver, copper, gold or palladium.

5. The product of claim 1, wherein said dielectric membrane is a membrane of an inorganic metal oxide, a metal sulfide, a metal fluoride, a polyurethane resin, an epoxy resin or an acrylic resin.

6. The product of claim 1, wherein said dielectric membrane is a membrane of $MgF_2$, SiO, $SnO_x$ where $1 \leq X \leq 2$, ZnS, $SiO_2$, $Si_2O_3$, $Al_2O_3$, TiO, $TiO_2$, $Bi_2O_3$ and $In_2O_{1-3}$.

7. The product of claim 1, wherein said dielectric membrane has a thickness of about 3,000 Å or less.

8. The product of claim 1, further including a protective coating layer of a synthetic resin on said dielectric membrane.

9. The product of claim 1, wherein said dielectric membrane has a refractive index of 1.5 or more for visible light and a visible light transmittance of 70% or more.

10. The product of claim 1, wherein the dielectric membrane has a thickness of about 1,000 Å or less.

* * * * *